US006590820B2

United States Patent
Nakagawa

(10) Patent No.: US 6,590,820 B2
(45) Date of Patent: Jul. 8, 2003

(54) SENSE AMPLIFIER WITH REFERENCE CELL CIRCUIT

(75) Inventor: Yukiharu Nakagawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 1 day.

(21) Appl. No.: 09/813,894

(22) Filed: Mar. 22, 2001

(65) Prior Publication Data
US 2001/0026490 A1 Oct. 4, 2001

(30) Foreign Application Priority Data
Mar. 29, 2000 (JP) ........................... 2000-091649

(51) Int. Cl.$^7$ ................................. G11C 7/02
(52) U.S. Cl. .................. 365/207; 365/205; 365/208; 365/210; 327/56
(58) Field of Search ................. 365/207, 205, 365/208, 210; 327/56

(56) References Cited

U.S. PATENT DOCUMENTS 5,982,662 A * 11/1999 Kobayashi et al. .... 365/185.03
6,016,276 A * 1/2000 Fuji ....................... 365/189.07
6,185,143 B1 * 2/2001 Perner et al. ............... 365/210
6,246,608 B1 * 6/2001 Odani ...................... 365/185.2

* cited by examiner

Primary Examiner—David Nelms
Assistant Examiner—Connie C. Yoha
(74) Attorney, Agent, or Firm—Young & Thompson

(57) ABSTRACT

A sense amplifier includes a differential circuit comparing data in memory cells and reference data in reference cells. The sense amplifier is provided with a first reference cell corresponding to a predetermined value of the threshold of a memory cell, a second reference cell corresponding to the determination of the memory cell having a high level at the time of high temperature or low temperature and a third reference cell corresponding to the determination of the memory cell having a low level at the time of high temperature or low temperature. The sense amplifier can thereby detect at room temperature a memory cell which would be defective at high temperature or low temperature.

15 Claims, 6 Drawing Sheets

SENSE AMPLIFIER WITH REFERENCE CELL CIRCUIT

BACKGROUND OF THE INVENTION

1. Field of the Invention

The present invention relates to a sense amplifier used in a semiconductor memory circuit, and more particularly, to a sense amplifier having a testing capability to predict memory cell operability under extreme temperature conditions.

2. Description of Related Art

A sense amplifier conventionally used for a semiconductor memory is provided with a reference cell for a reference amplifier.

Referring to FIG. 5, a conventional sense amplifier is provided with a memory cell amplifier 550 that senses data in a memory cell 560 and amplifies the data, a reference cell 530 that outputs voltages corresponding to the operation of the memory cell 560 and a differential circuit 540 that compares the output of the memory cell amplifier 550 and the output of the reference amplifier 520. The memory cell amplifier 550 is coupled to a 1-kbit or higher memory cell.

Comparing the output of the amplifier 550 and output of reference amplifier 520 permits rejecting a defective memory cell, in a testing mode of the device.

However, recently, because of increased variation in the threshold Vt of a transistor due to the miniaturization of a cell and temperature-dependency, a memory cell which is operable at room temperature may become defective at the time of high temperature or low temperature.

Therefore, there is a problem that, as a cell that is defective only at high temperature or low temperature cannot be identified by testing at room temperature, defective memory cells maybe included in a device.

SUMMARY OF THE INVENTION

An object of the present invention is to provide a sense amplifier that rejects at room temperature, a memory cell that would become defective at high temperature or low temperature.

A first sense amplifier according to the present invention includes: a plurality of memory cells; a first amplifier connected to each of the memory cells and generating an output voltage in response to an active memory cell; a reference cell generating a reference signal; a second amplifier connected to the reference cell circuit, generating one of first and second reference voltages in response to the reference signal; and a differential circuit connected to the first and second amplifiers and comparing the output voltage of the first amplifier with one of the first and second reference voltages, wherein the first reference voltage is a first threshold to determine whether the output voltage is high or low.

A second sense amplifier according to the present invention includes: a plurality of memory cells; a first amplifier connected to each of the memory cells; a reference cell circuit generating a reference signal; a second amplifier connected to the reference cell circuit and generating a reference voltage in response to the reference signal; and a comparing interface having first and second differential circuits, each of the first and second differential circuits comparing an output voltage of the first amplifier with the reference voltage, the first differential circuit having a first threshold and determining whether the output voltage is high or low, and the second differential circuit having a second threshold which is different from the first threshold.

These and other objects of the present invention will be apparent to those of skill in the art from the appended claims when read in light of the following specification and accompanying figures.

DETAILED DESCRIPTION OF THE PREFERRED EMBODIMENTS

Figure 1:
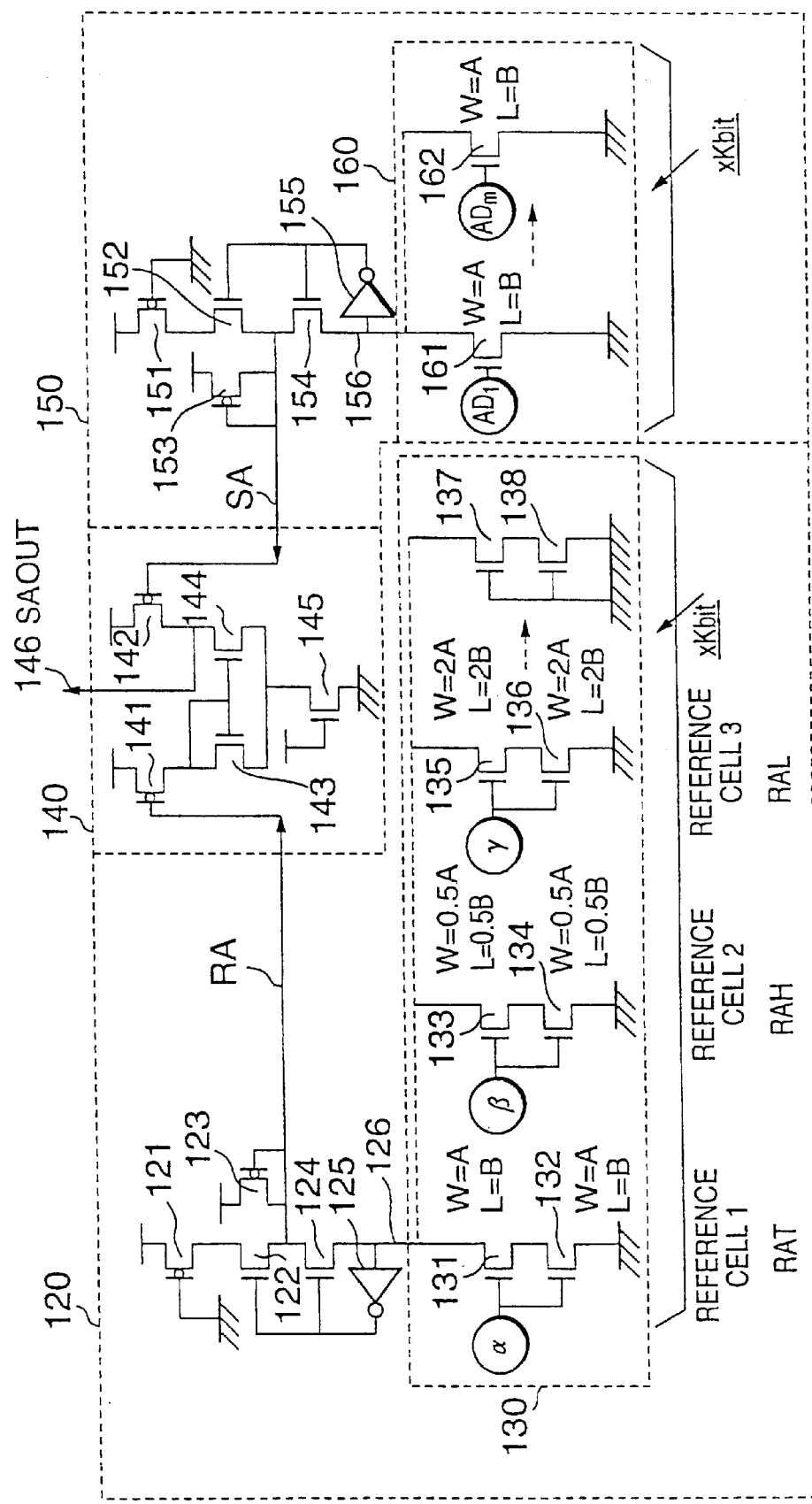
FIG. 1 is a circuit diagram showing a sense amplifier according to a first embodiment of the invention.

Referring to FIG. 1, the sense amplifier according to the first embodiment of the invention is provided with a memory cell amplifier 150 that senses data in a memory cell 160 and amplifies the data, a reference amplifier 120 including a reference cell circuit 130 that monitors the operation for the memory cell 160, and a differential circuit 140 that compares the output of the memory cell amplifier 150 and the output of the reference amplifier 120.

The memory cell includes a plurality of memory transistors 161, 162. Each memory transistor has a source-drain path connected between the memory cell amplifier 150 and ground, and a gate provided with a signal ADm (m=1~n) in response to address signals. If the memory transistor has a high threshold, an expected value of the memory transistor is high. On the other hand, if the memory transistor has a low threshold, the expected value of the memory transistor is low.

The reference amplifier 120 of the sense amplifier according to the present invention is connected to reference cell circuit 130. The reference cell circuit 130 includes a first reference cell determining whether a data of the memory cell 160 is high or low, a second reference cell that is used to test operability of the memory cell 160 which has high level as the expected value at the time of high temperature or low temperature, a third reference cell that is used to test operability of the memory cell 160 which has a low level as the expected value at the time of high temperature or low temperature, and a plurality of dummy cells that is provided to equalize drain capacity of transistor 124 with drain capacity of transistor 154.

Thus, the sense amplifier of the first embodiment of the invention is provided with three types of reference cells for one reference amplifier in the sense amplifier. These three types of reference cells each generate a respective reference voltage RAT, RAH and RAL.

In FIG. 1, the first reference cell has two transistors 131, 132 of which the gate length L and the gate width W are each set so that they are equal to the gate length L and the gate width W of a transistor 161 of the memory cell 160. The reference circuit 130 generates a reference voltage RAT in response to the first reference cell.

The second reference cell has two transistors 133, 134 whose gate length L and gate width W are set so that they are equal to ½ of the gate length and ½ of the gate width of the transistor 161 of the memory cell 160. The reference circuit 130 generates a reference voltage RAH in response to the second reference cell.

The third reference cell has two transistors 135, 136 whose gate length L and the gate width W are each set so that they are twice gate length and twice the gate width of the transistor 161 of the sense cell. The reference circuit 130 generates a reference voltage RAL in response to the third reference cell.

The level of the reference voltage RAH and RAL will now be described with reference to FIG. 2.

Figure 2:
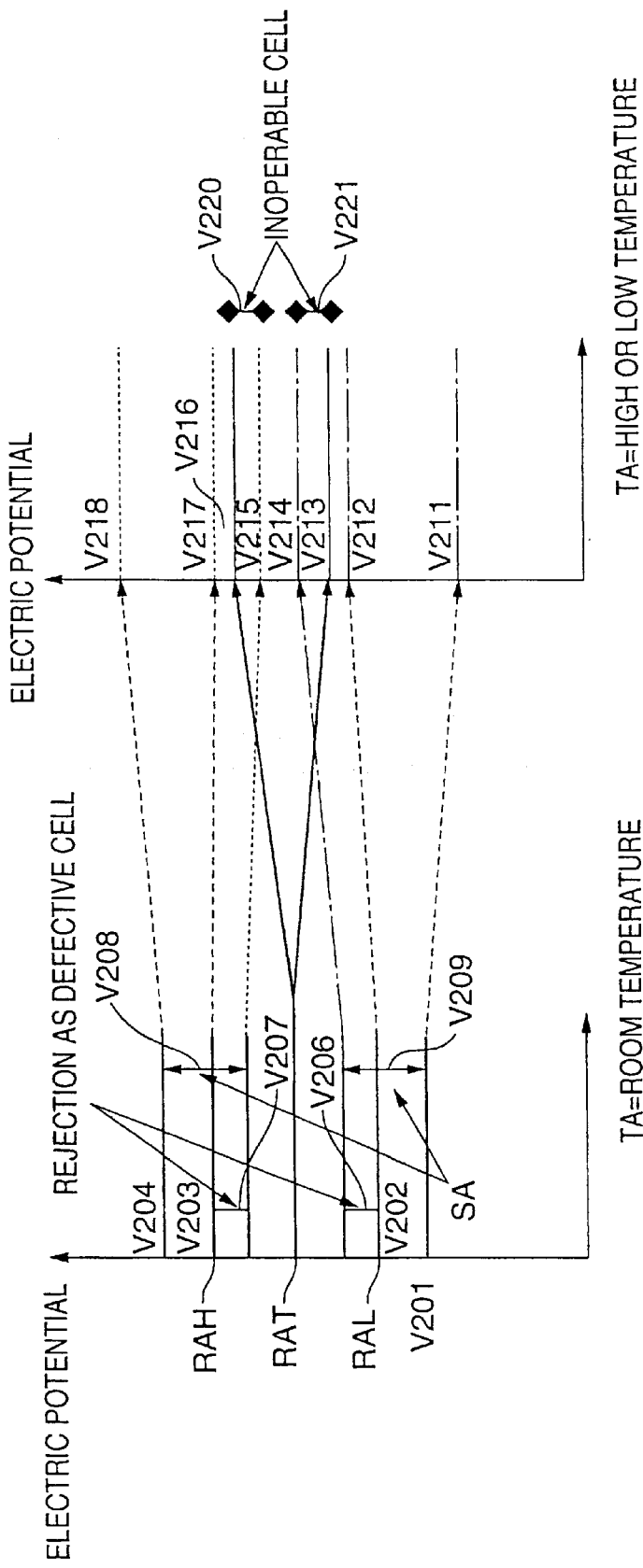
FIG. 2 shows the potential level of the sense amplifier shown in FIG. 1.

In a normal sense operation, the output voltage SA of the memory cell amplifier 150 which amplifies a data of memory cell 160 having an expected value "H", has variability V208 at room temperature as shown in the left side of FIG. 2. The variability V208 results from the manufacture process. However, at high or low temperature, the variability of the output voltage SA ranges from V218 to V215 as shown in the right side of FIG. 2, because the threshold Vt of a transistor varies in response to temperature. The reference voltage RAT, which determines whether a data of the memory cell 160 is high or low, also ranges from V213 to V216 at high or low temperature. Accordingly, at high or low temperature, if the memory cell amplifier 150 outputs the output voltage SA between V215 and V216 relative to the reference voltage RAT at the level V216, the differential circuit 140 erroneously determines a low level as the data of selected memory transistor in spite of the expected value "H".

Similarly, in the normal sense operation, the output voltage SA of the memory cell amplifier 150 which amplifies a data of memory cell 160 having an expected value "L" has variability V209 at room temperature. However, at high or low temperature, the variability of the output voltage SA ranges from V211 to V213. Accordingly, at high or low temperature, if the memory cell amplifier 150 outputs the output voltage SA between V212 and V213 relative to the reference voltage RAT at the level V213, the differential circuit 140 erroneously determines a high level as the data of selected memory transistor in spite of the expected value "L".

Therefore, the level of the reference voltage RAH is defined as the level V203, which is the lowest level recognized as "H" V217 at high or low temperature in normal sense operation. The level of the reference voltage RAL is defined as the level V202, that is the highest level recognized as "L" V212 at high or low temperature in normal sense operation. In a test sense operation, the differential circuit 140 compares the output voltage SA with each of the reference voltages RAH and RAL at room temperature. As shown in the left of FIG. 2, if the memory cell amplifier outputs the output voltage within V206 or V207 at room temperature or the output signal SAOUT is not identical with the expected value in the test sense operation, the selected memory transistor is judged to be not operable at high temperature or low temperature, even if the data of the memory transistor is operable at room temperature. Thus, a memory transistor that is defective at high or low temperature can be identified at room temperature.

In order to set the level of the signal line RA being the reference voltage RAH, a high level is input to the gate β of the second reference cell and both of the gates and γ are provided with a low level. Similarly, in order to set the level of the signal line RA being the reference voltage RAL, a high level is input to the gate γ of the third reference cell and both of the gates and β are provided with a low level.

In the normal sense operation, the gate of the reference cell is supplied with a high level, and both of gates β and γ are supplied with a low level. In normal sense operation, the data of memory transistor selected in response to the address signals is determined whether high or low level.

In the test sense operation, one of the gates β and γ is supplied with a high level in response to test enable signals which are provided from an external terminal, and the gate is provided with a low level. When the gate β is supplied with a high level, the differential circuit compares the output voltage SA with the reference voltage RAH at room temperature in order to determine whether the selected memory transistor having an expected value "H" is operable or not at the time of high temperature or low temperature. When the gate γ is supplied with a high level, the differential circuit 140 compares the output voltage SA with the reference voltage RAL at room temperature in order to determine whether the memory transistor having an expected value "L" is operable or not at the time of high temperature or low temperature.

Thus, the sense amplifier of the present invention can rejects at room temperature a memory transistor that would become defective at high temperature or low temperature.

Figure 3:
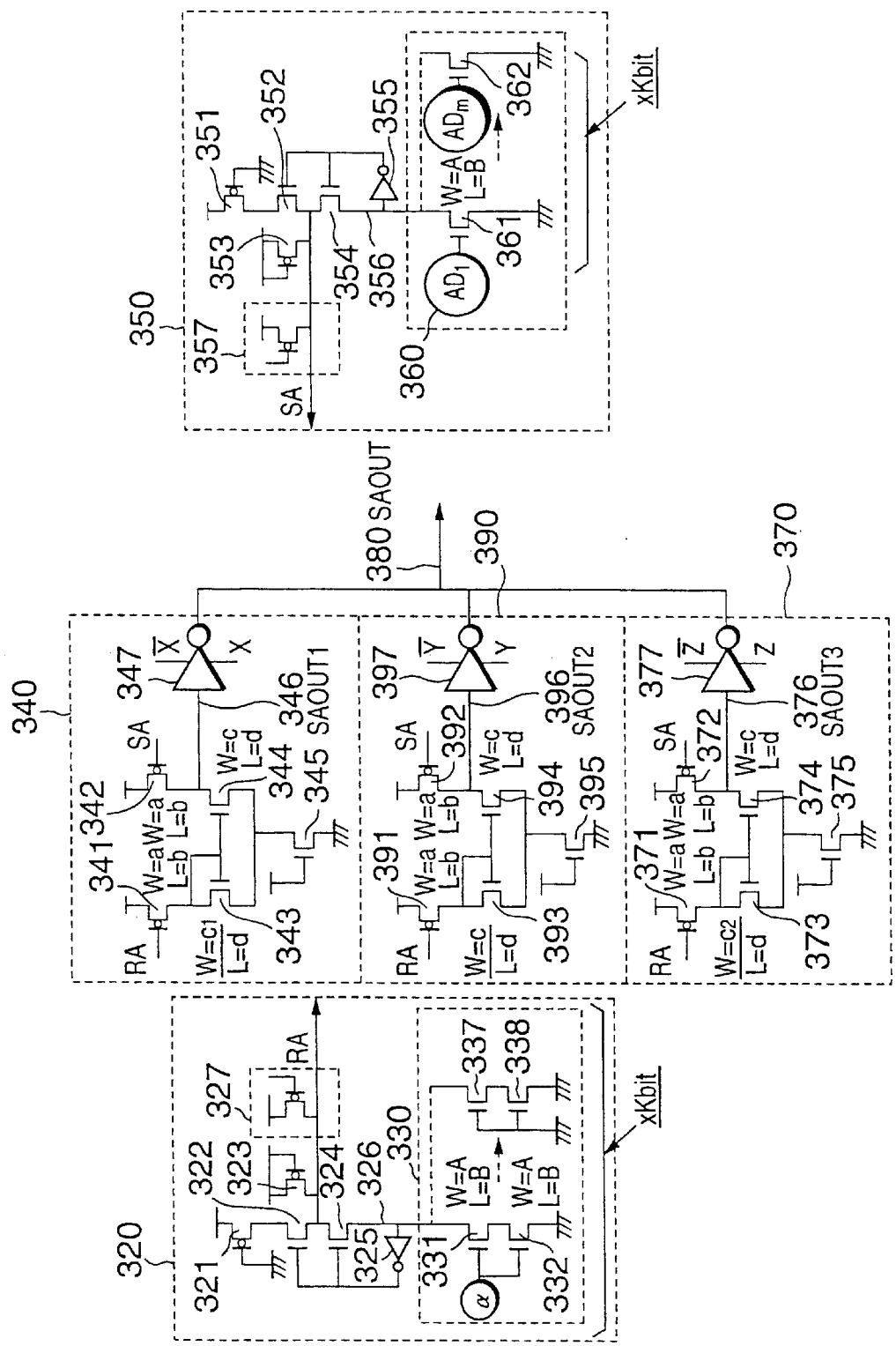
FIG. 3 is a circuit diagram showing a sense amplifier according to a second embodiment of the invention.

FIG. 3 shows a sense amplifier in the second embodiment of the present invention.

Referring to FIG. 3, the sense amplifier to the second embodiment of the invention is provided with three sets of differential circuits (340, 390 and 370). Each of these differential circuits compares the output level RA of a reference amplifier 320 and the output level SA of memory cell amplifier 350.

Figure 4:
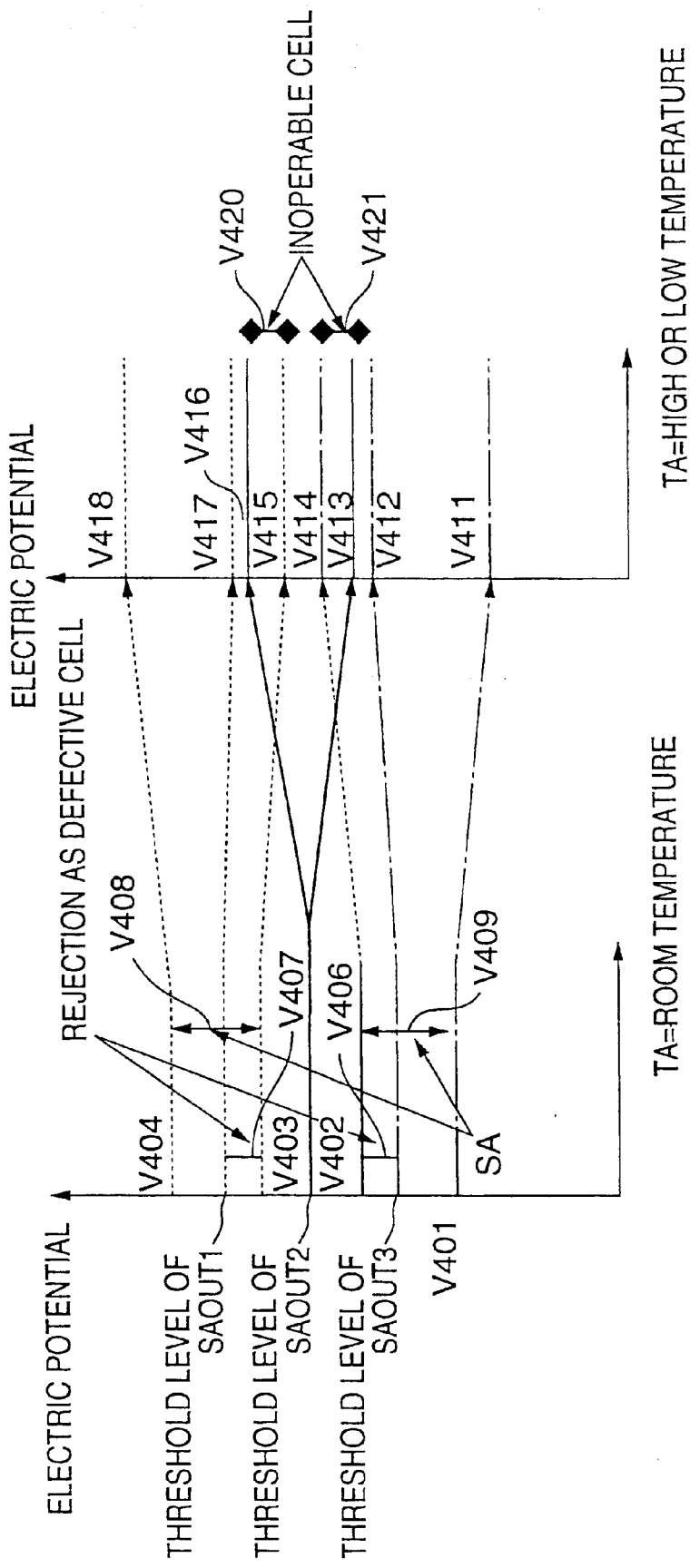
FIG. 4 shows the potential level of the sense amplifier shown in FIG. 3.
Figure 5:
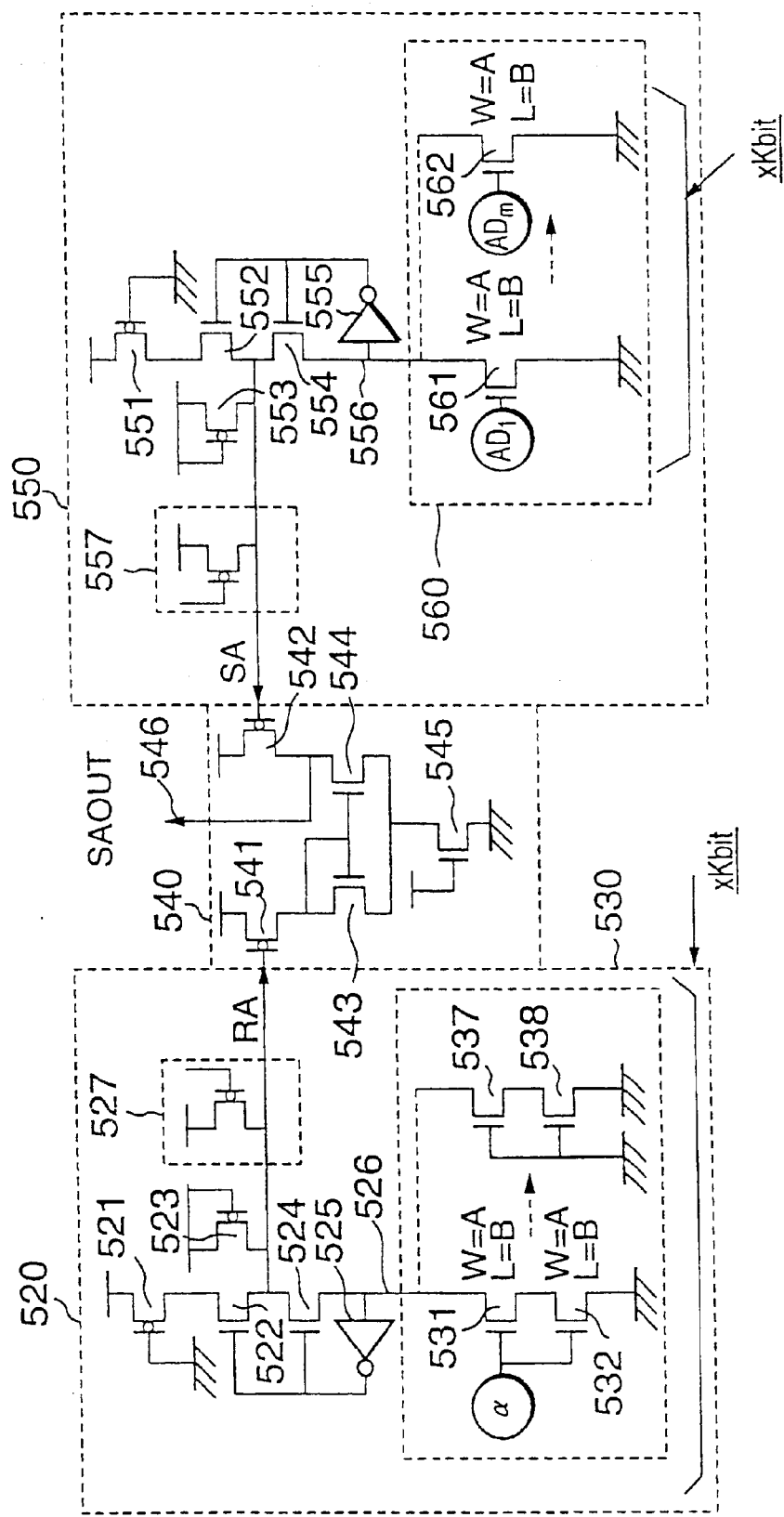
FIG. 5 is a circuit diagram showing a conventional sense amplifier.
Figure 6:
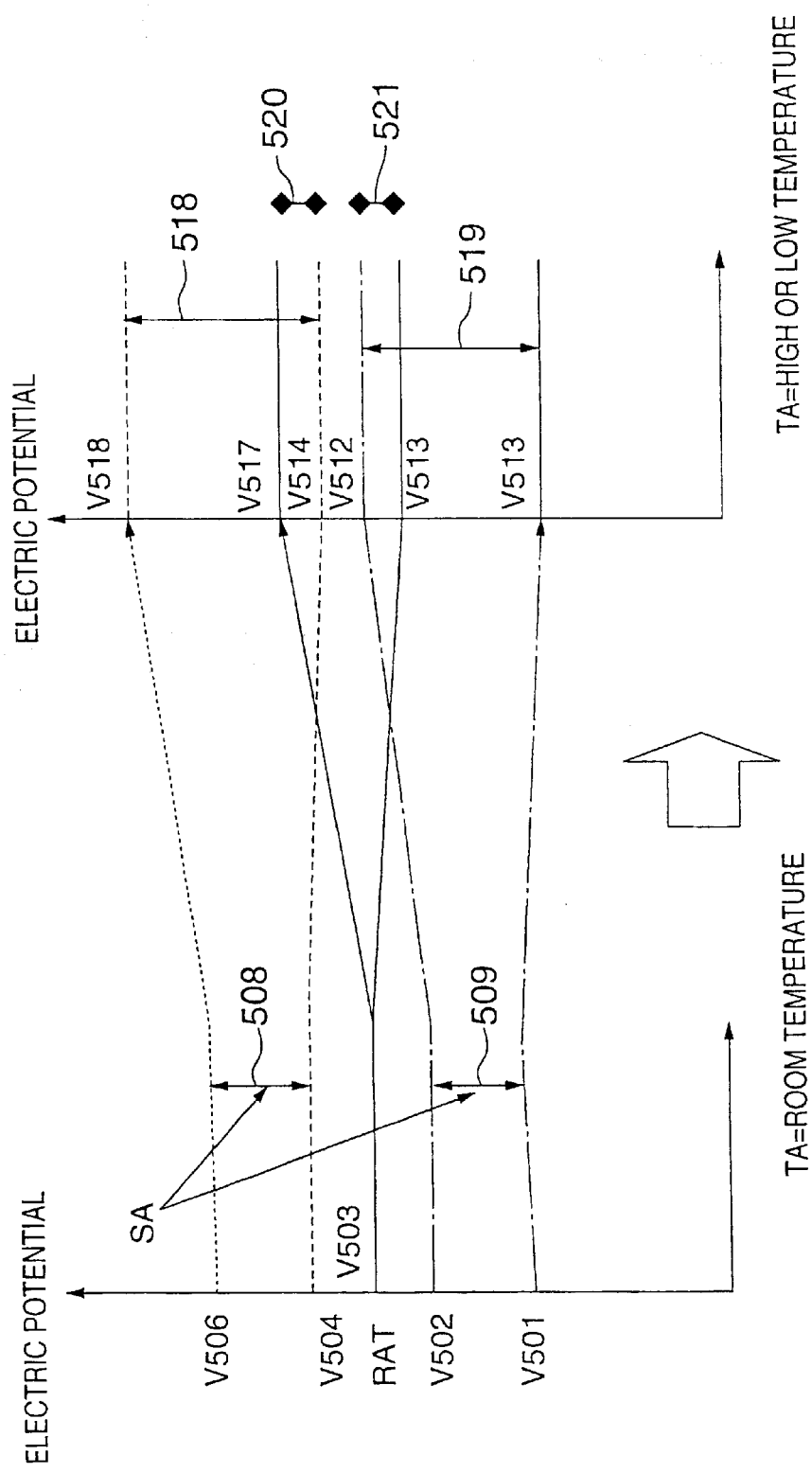
FIG. 6 shows the potential level of the sense amplifier shown in FIG. 5.

Each of differential circuit (340, 390 and 370) has a respective threshold level inverted the output level SA of the amplifier 350 shown in FIG. 4.

In a normal sense operation, the first differential circuit 390 is used to determine whether a data of the memory cell 360 is high or low. At room temperature, the output voltage SA of the memory cell amplifier 350 which amplifies a data of memory cell 360 having an expected value "H" has variability V408 as shown in the left of FIG. 4. However, at high temperature or low temperature, the variability of the output voltage SA ranges from V415 to V418 as shown in the right of FIG. 4. The first threshold level of SAOUT2 also ranges from V413 to V416 at high temperature or low temperature. If the memory cell amplifier 150 outputs the output voltage SA between V415 and V416 relative to the threshold level of SAOUT2 at the level V416 at high temperature or low temperature, the differential circuit 390 outputs a low level as the data of selected memory transistor in spite of the expected value "H".

Similarly, in the normal sense operation, the output voltage SA of the memory cell amplifier 350 which amplifies a data of memory cell 360 having an expected value "L" has variability V409 at room temperature. However, at high or low temperature, the variability of the output voltage SA ranges from V411 to V413. At high temperature or low temperature, if the memory cell amplifier 350 outputs the output voltage SA between V412 and V413 relative to the threshold voltage of SAOUT2 at the level V413, the differential circuit 390 determines a high level as the data of selected memory transistor in spite of the expected value "L".

Therefore, the threshold level of SAOUT1 is defined as the level of V417 at high temperature or low temperature. The threshold level of SAOUT3 is defined as the level of V414 at high or low temperature.

In a test sense operation, the differential circuit 340 is used to test operability of the memory cell 360 having a high level as the expected value. In such a test sense operation, if the memory cell amplifier 350 outputs the output voltage SA within V407 at room temperature, the selected memory transistor is regarded as defective because of the memory transistor being inoperable at high temperature or low temperature. Similarly, the differential circuit 370 is used to test operability of the memory cell 360 having a low level as the expected value. If the memory cell amplifier 350 outputs the output voltage SA within V406 at room temperature, the selected memory transistor is regarded as defective because of the memory transistor being inoperable at high temperature or low temperature.

Thus, a memory transistor that is defective at high or low temperature can be identified at room temperature.

The usage of these three types of differential circuits is as follows.

In the normal sense operation, in order to determine whether a data in the memory cell is high level or low level, the output SAOUT2 of the differential circuit 390 is used. Accordingly, a signal X of buffer 347, a signal /Y of buffer 397 and a signal Z of buffer 377 are each set to be a low level. A signal /X of buffer 347, a signal Y of buffer 397 and a signal /Z of buffer 377 are each set to be a high level.

In the test sense operation, in order to determine whether the memory cell having the expected value "H" is operable or not at high temperature or low temperature, the output SAOUT1 of the differential circuit 340 is used. That is, the signal X, the signal /Y and the signal /Z are each supplied with a high level, the signal /X, the signal Y and the signal Z are each supplied with a low level. In order to determine whether the memory cell having the expected value "L" is operable or not at high temperature or low temperature, the output SAOUT3 of the differential circuit 370 is used. Thus, the signal X, the signal Y and the signal /Z are each supplied with a low level and the signal /X, the signal /Y and the signal Z is supplied with a high level.

That is, the memory cell that becomes a defective cell at the time of high temperature or low temperature is detected.

As described above, the differential circuit compares the output voltage of memory cell amplifier with each of reference voltages. Intest sense operation, when the memory transistor having high threshold is tested, the differential circuit compares the output voltage of memory cell amplifier with the reference voltage RAH that is higher than the reference voltage RAT used for normal sense operation at room temperature. When the memory transistor having low threshold is tested, the differential circuit compares the output voltage of memory cell amplifier with a reference voltage RAL that is lower than the reference voltage RAT at room temperature. As a result, operating performance of the memory cell at high temperature or low temperature can be evaluated indirectly by determining in test sense operation at room temperature and the memory cell which becomes defective at high temperature or low temperature can be detected at room temperature.

While preferred embodiments of the present invention have been described, it is to be understood that the invention is to be defined by the appended claims when read in light of the specification and when accorded their full range of equivalents.

What is claimed is:

1. A sense amplifier, comprising:
   a plurality of memory cells;
   a first amplifier connected to each of said memory cells and generating an output voltage in response to an activated one of said memory cells;
   a reference cell circuit generating a reference signal;
   a second amplifier connected to said reference cell circuit, and generating one of first and second reference voltages in response to the reference signal, said first reference voltage having a first value, and said second reference voltage having a second value which is different from said first value, the reference signal determining whether the first reference voltage or the second reference voltage is output from the second amplifier; and
   a differential circuit connected to said first and second amplifiers and comparing said output voltage with one of said first and second reference voltages,
   wherein said reference cell circuit includes first and second reference cells, said first reference cell comprising a first transistor having a first gate length and a first gate width, said second reference cell comprising a second transistor having a second gate length and a second gate width which are different from said first gate length and said first gate width respectively, said second amplifier generating said first reference voltage in response to said first reference cell being activated and said second reference voltage in response to said second reference cell being activated.

2. The sense amplifier as claimed in claim 1, wherein each of said memory cells comprises a memory transistor, said first gate length and said first gate width are equal to a gate length and a gate width of said memory transistor respectively, and said second gate length and said second gate width are equal to half of said gate length and half of said gate width of said memory transistor respectively.

3. The sense amplifier as claimed in claim 1, wherein each of said memory cells includes a memory transistor, said first gate length and said first gate width are equal to a gate length and a gate width of said memory transistor respectively, and said second gate length and said second gate width are equal to twice said gate length and twice said gate width of said memory transistor respectively.

4. A sense amplifier, comprising:
   a plurality of memory cells;
   a first amplifier connected to each of said memory cells and generating an output voltage in response to an activated one of said memory cells;
   a reference cell circuit generating a reference signal;
   a second amplifier connected to said reference cell circuit, and generating one of first and second reference voltages in response to the reference signal, said first reference voltage having a first value, and said second reference voltage having a second value which is different from said first value, the reference signal determining whether the first reference voltage or the second reference voltage is output from the second amplifier; and
   a differential circuit connected to said first and second amplifiers and comparing said output voltage with one of said first and second reference voltages,
   wherein said first reference voltage determines whether said output voltage is high or low, said second reference voltage has said second value at room temperature indicative of a limit of said output voltage recognized as a predetermined level when said differential circuit compares said output voltage with said first reference voltage at a predetermined temperature, whereby operating performance of said memory cell having said predetermined level as an expected value at a predetermined elevated or reduced temperature can be evaluated indirectly at room temperature by comparing said output voltage with said second reference voltage.

5. The sense amplifier as claimed in claim 4, wherein said predetermined level is high level.

6. The sense amplifier as claimed in claim 4, wherein said predetermined level is a low level.

7. The sense amplifier as claimed in claim 1, wherein said second amplifier further generates a third reference voltage in response to said reference signal, said differential circuit compares said output voltage with one of said first, second and third reference voltage.

8. The sense amplifier as claimed in claim 7, wherein said reference cell circuit further includes a third reference cell having a third transistor, and said second amplifier generates said third reference voltage in response to said third reference cell being activated.

9. A sense amplifier, comprising:
a plurality of memory cells;
a first amplifier connected to each of said memory cells and generating an output voltage in response to an activated one of said memory cells;
a reference cell circuit generating a reference signal;
a second amplifier connected to said reference cell circuit, and generating one of first and second reference voltages in response to the reference signal, said first reference voltage having a first value, and said second reference voltage having a second value which is different from said first value, the reference signal determining whether the first reference voltage or the second reference voltage is output from the second amplifier; and
a differential circuit connected to said first and second amplifiers and comparing said output voltage with one of said first and second reference voltages,
wherein said second amplifier further generates a third reference voltage in response to said reference signal, said differential circuit compares said output voltage with one of said first, second and third reference voltage, and
wherein said first reference voltage determines whether said output voltage is high or low, said second reference voltage has said second value at room temperature indicative of a first limit of said output voltage recognized as high level when said differential circuit compares said output voltage with said first reference voltage at a predetermined elevated or reduced temperature, said third reference voltage has said third value at room temperature indicative of a second limit of said output voltage recognized as low level when said differential circuit compares said output voltage with said first reference voltage at a predetermined elevated or reduced temperature, whereby operating performance of each of said memory cell having said high and low level as expected value at said predetermined temperature can be evaluated indirectly at room temperature by comparing said output voltage with each of said second and third reference voltage.

10. A sense amplifier, comprising:
a plurality of memory cell;
a first amplifier connected to each of said memory cells and amplifying;
a reference cell circuit generating a reference signal;
a second amplifier connected to said reference cell circuit and generating a reference voltage in response to said reference signal; and
a comparing interface having first and second differential circuits, each of said first and second differential circuit comparing an output voltage of said first amplifier with said reference voltage, said first differential circuit having a first threshold and determining whether said output voltage is high or low, and said second differential circuit having a second threshold which is different from said first threshold,
wherein said second threshold has a first value at room temperature indicative of a first limit of said output voltage recognized as a predetermined level at a predetermined elevated or reduced temperature, whereby operating performance of said memory cell having a predetermined level as expected value at said predetermined temperature can be evaluated indirectly at room temperature by using said second differential circuit.

11. The sense amplifier as claimed in claim 10, wherein said predetermined level is high level.

12. The sense amplifier as claimed in claim 10, wherein said predetermined level is low level.

13. The sense amplifier as claimed in claim 10, wherein said comparing interface further comprises a third differential circuit comparing said output voltage with said reference voltage and having a third threshold.

14. A sense amplifier, comprising:
a plurality of memory cell;
a first amplifier connected to each of said memory cells and amplifying;
a reference cell circuit generating a reference signal;
a second amplifier connected to said reference cell circuit and generating a reference voltage in response to said reference signal; and
a comparing interface having first and second differential circuits, each of said first and second differential circuit comparing an output voltage of said first amplifier with said reference voltage, said first differential circuit having a first threshold and determining whether said output voltage is high or low, and said second differential circuit having a second threshold which is different from said first threshold,
wherein said comparing interface further comprises a third differential circuit comparing said output voltage with said reference voltage and having a third threshold, and
wherein said second and third thresholds have first and second value at room temperature indicative of first and second limits of said output voltage recognized as first and second predetermined level at a predetermined elevated or reduced temperature, respectively, whereby operating performance of said memory cell having said first and second predetermined levels as expected value at said predetermined temperature can be evaluated indirectly at room temperature by using said second and third differential circuits.

15. A sense amplifier, comprising:
a plurality of memory cell;
a first amplifier connected to each of said memory cells and amplifying;
a reference cell circuit generating a reference signal;
a second amplifier connected to said reference cell circuit and generating a reference voltage in response to said reference signal; and
a comparing interface having first and second differential circuits, each of said first and second differential circuit comparing an output voltage of said first amplifier with said reference voltage, said first differential circuit having a first threshold and determining whether said output voltage is high or low, and said second differential circuit having a second threshold which is different from said first threshold, wherein said first differential circuit includes first and second transistors connected in series between a power supply and a first current source, and third and fourth transistors connected in series between said power supply and said first current source, a gate of said first transistor being supplied with said output voltage, a gate of said third transistor being supplied with said reference voltage, and said fourth transistor having a gate connected to a gate of said second transistor and a drain connected to said gate of said second transistor; and wherein said second differential circuit includes fifth and sixth transistors connected in series between said power supply and a second current source and seventh and eighth transistors connected in series between said power supply and said second current source, a gate of said fifth transistor being supplied with said output voltage, a gate of said seventh transistor being supplied with said reference voltage, and said eighth transistor having a gate connected to a gate of said sixth transistor and a drain connected to said gate of said sixth transistor, wherein a gate width of said fourth transistor is different from a gate width of said eighth transistor, said first transistor being substantially equal to said third, fifth and seventh transistors in gate width, and said second transistor being substantially equal to said sixth transistor in gate width.

* * * * *